United States Patent [19]

Toyoda

[11] Patent Number: 5,097,205

[45] Date of Patent: Mar. 17, 1992

[54] IC CHIP TEST CIRCUIT FOR HIGH FREQUENCY INTEGRATED CIRCUITS

[75] Inventor: Nobuyuki Toyoda, Yokohama, Japan

[73] Assignee: Kabushiki Kaisha Toshiba, Kawasaki, Japan

[21] Appl. No.: 505,607

[22] Filed: Apr. 6, 1990

[30] Foreign Application Priority Data

May 2, 1989 [JP] Japan .................................. 1-113308

[51] Int. Cl.⁵ ...................... G01R 3/28; H03R 17/693
[52] U.S. Cl. .............................. 324/158 R; 324/73.1; 307/303
[58] Field of Search ........ 324/73.1 R, 158 R; 307/475, 303.1, 303; 371/15.1, 22.1, 22.5, 22.6; 370/112

[56] References Cited

U.S. PATENT DOCUMENTS

| | | | |
|---|---|---|---|
| 4,278,897 | 7/1981 | Ohno et al. | 307/303 |
| 4,697,095 | 9/1987 | Fujii | 307/303 |
| 4,899,339 | 2/1990 | Shiragaki et al. | 370/112 |
| 4,905,240 | 2/1990 | Kimoto | 371/22.1 |
| 4,905,241 | 2/1990 | Schmid et al. | 371/22.5 |
| 4,912,346 | 3/1990 | Mizuta | 307/475 |

Primary Examiner—Kenneth Wieder
Assistant Examiner—Vinh P. Nguyen
Attorney, Agent, or Firm—Oblon, Spivak, McClelland, Maier & Neustadt

[57] ABSTRACT

In an IC device, an IC body having a predetermined function and high-frequency circuits for testing high-frequency characteristics of the IC body are formed on a single chip. The test circuits include an L-H frequency conversion circuit arranged on the input side of the IC body and an H-L frequency conversion circuit arranged on the output side. The test circuits can switch a connecting state between the conversion circuits and the IC body in response to an external control signal. The test circuits can be disconnected from the IC body after a test is completed.

4 Claims, 4 Drawing Sheets

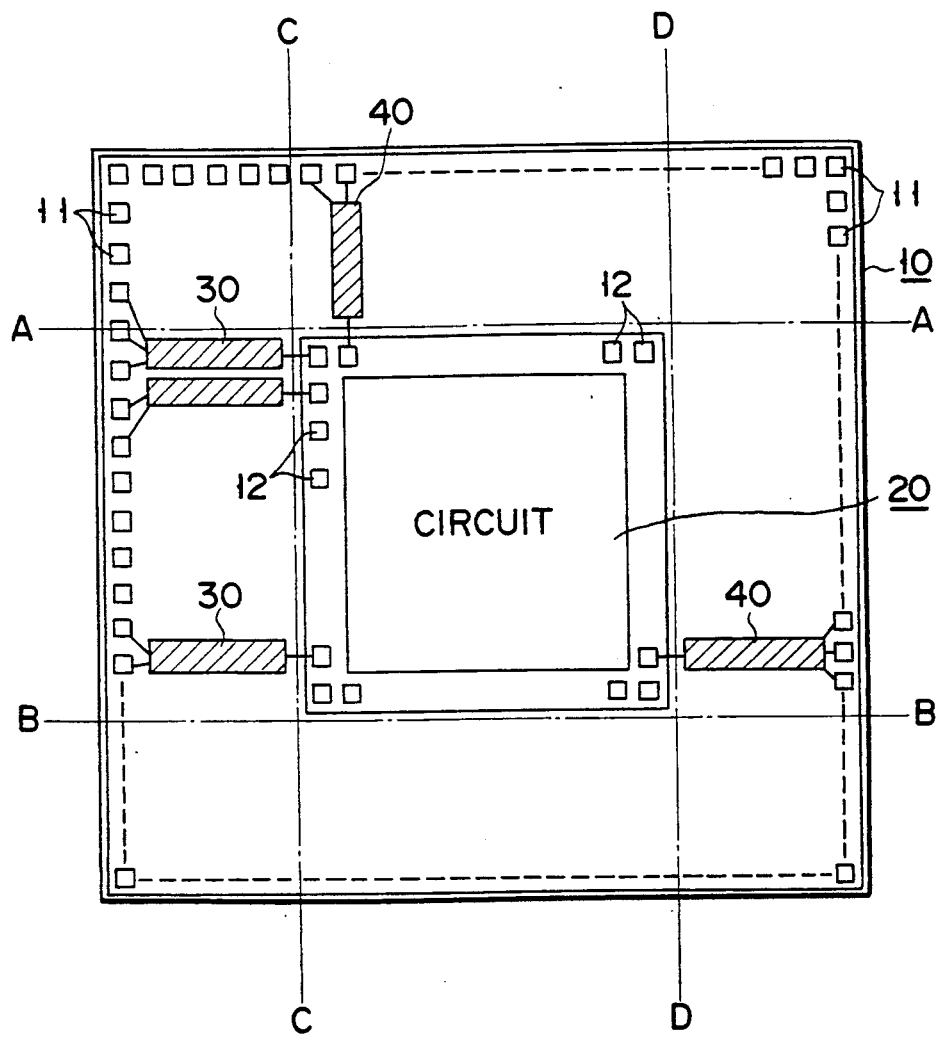
F I G. 6

IC CHIP TEST CIRCUIT FOR HIGH FREQUENCY INTEGRATED CIRCUITS

BACKGROUND OF THE INVENTION

1. Field of the Invention

The present invention relates to an IC device and, more particularly, to an IC device including a test easy circuit for facilitating a high-frequency test.

2. Description of the Related Art

In recent years, an operating frequency of an IC has been remarkably increased with a demand from an application field of, e.g., communication and computers, and the development of micro-lithography. In particular, an operating frequency of an IC such as a silicon ECL or a gallium arsenide IC reaches 500 MHz to several GHz.

On the other hand, in the manufacture of an IC, a test for IC chips arranged on a wafer is performed after the wafer manufacturing steps are completed. Although an LSI tester is conventionally used for this test, an LSI tester which is commonly employed at present can perform only a test using an operating frequency signal of a maximum of 200 MHz. For this reason, at present, it is difficult to perform a high-frequency test for the above-mentioned IC chip having an operating frequency of 500 MHz to several GHz using the conventional LSI tester.

Conventionally, when an operating frequency of an IC is increased to exceed a frequency used in a normal LSI tester for a test, high-speed measuring apparatuses are combined to test only a part of the IC. However, such measuring apparatuses are extremely expensive. In addition, when such a test system is prepared, equipment cost of a manufacturing line is increased, thus causing an increase in manufacturing cost.

SUMMARY OF THE INVENTION

It is an object of the present invention to provide an IC device which allows a high-frequency test for an IC using an LSI tester having an operating frequency which is lower than that of the IC, and can contribute to facilitation of a high-frequency test and a decrease in manufacturing cost.

According to the present invention, an IC body having a predetermined function and a high-frequency circuit for testing high-frequency characteristics of the IC body are formed on a single chip to allow a high-frequency test using a conventional LSI tester having an operating frequency which is lower than that of the IC. The test circuit includes a Low-High (L-H) frequency conversion circuit arranged on the input side of the IC body, and a High-Low (H-L) frequency conversion circuit arranged on the output side of the IC body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 6 is a plan view showing an IC device for explaining another embodiment of the present invention.

DETAILED DESCRIPTION OF THE PREFERRED EMBODIMENTS

Figure 1:
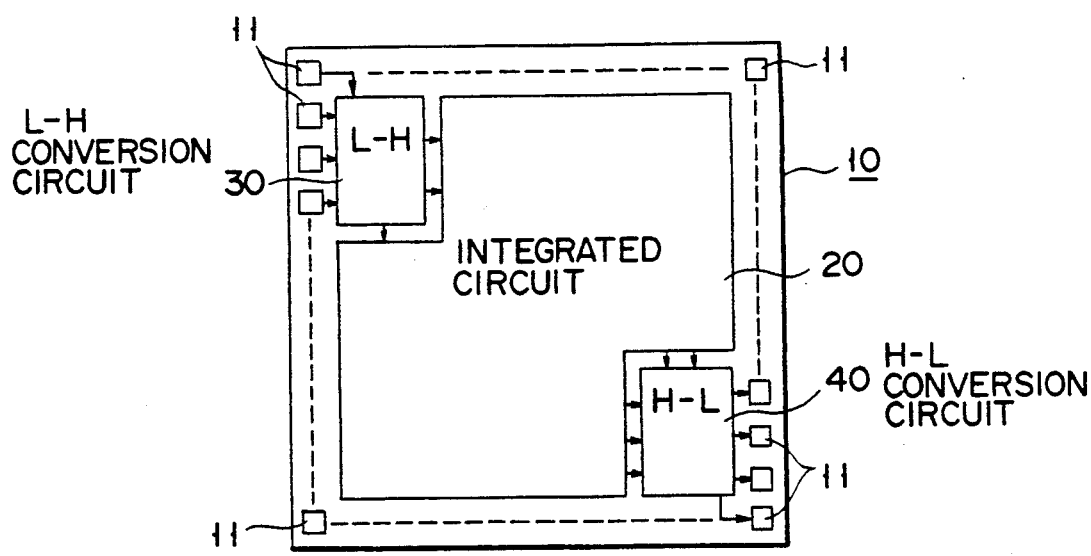
FIG. 1 is a schematic plan view showing an IC device according to an embodiment of the present invention.

Referring to FIG. 1, a semiconductor chip 10 includes an IC body 20 arranged in a central region, a plurality of bonding pads 11 arranged in a peripheral region, and conversion circuits 30 and 40, which are symmetrical to connect the IC body 20 and the pads 11, for respectively performing two different operations. More specifically, input and output sections are respectively arranged in upper left and lower right notched portions of the IC body 20, as shown in FIG. 1. In addition, the low-high frequency conversion circuit (to be referred to as an L-H conversion circuit hereinafter) 30, serving as an input conversion circuit, connected to be opposite to the input section, and the high-low frequency conversion circuit (to be referred to as an H-L conversion circuit hereinafter) 40, serving as an output conversion circuit, connected to be opposite to the output section are arranged. The plurality of bonding pads 11 which can be used as test terminals are arranged around the semiconductor chip 10 to surround the above-mentioned circuits 20, 30, and 40. For example, the L-H and H-L conversion circuits 30 and 40 are connected to the required number of bonding pads 11 each spaced apart from the circuits 30 and 40 by the shortest distance.

Figure 2A:
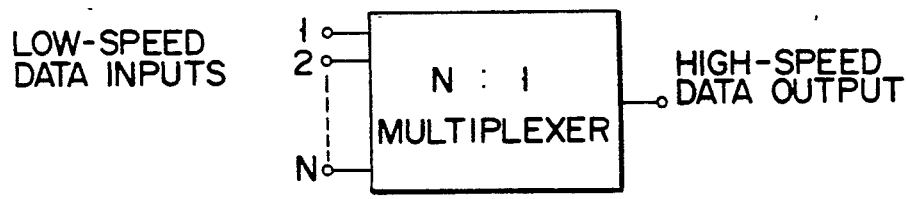
FIG. 2A is a block diagram showing an arrangement of a multiplexer used in the embodiment.

The L-H conversion circuit 30 shown in FIG. 2A serves as an N:1 multiplexer, and has a function for converting N low-speed data into one high-speed data train.

Figure 2B:
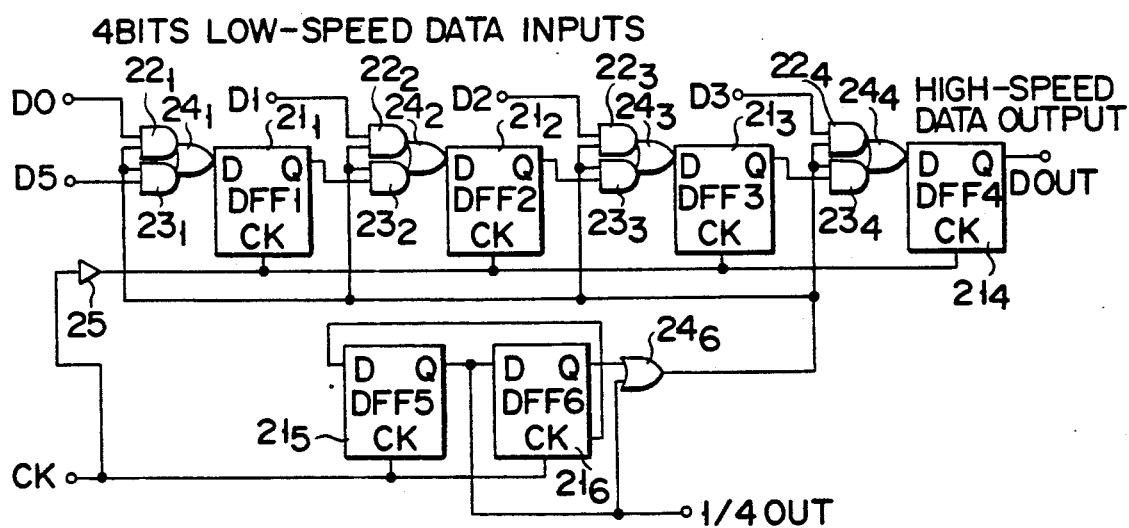
FIG. 2B is a circuit diagram showing an arrangement of the multiplexer.

More specifically, for example, the 4:1 multiplexer 30 shown in FIG. 2B has a known circuit arrangement including six D flip-flops (DFFs) $21_1$ to $21_6$, AND gates $22_1$ to $22_4$ and $23_1$ to $23_4$, OR gates $24_1$ to $24_4$ and $24_6$, and an inverter 25. With this arrangement, the multiplexer 30 receives 4-bit low-speed data $D_0$ to $D_3$ to output one high-speed data $D_{OUT}$.

Figure 3A:
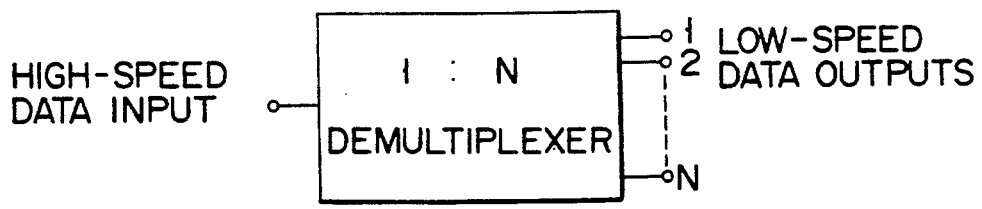
FIG. 3A is a block diagram showing an arrangement of a demultiplexer used in the embodiment.
Figure 3B:
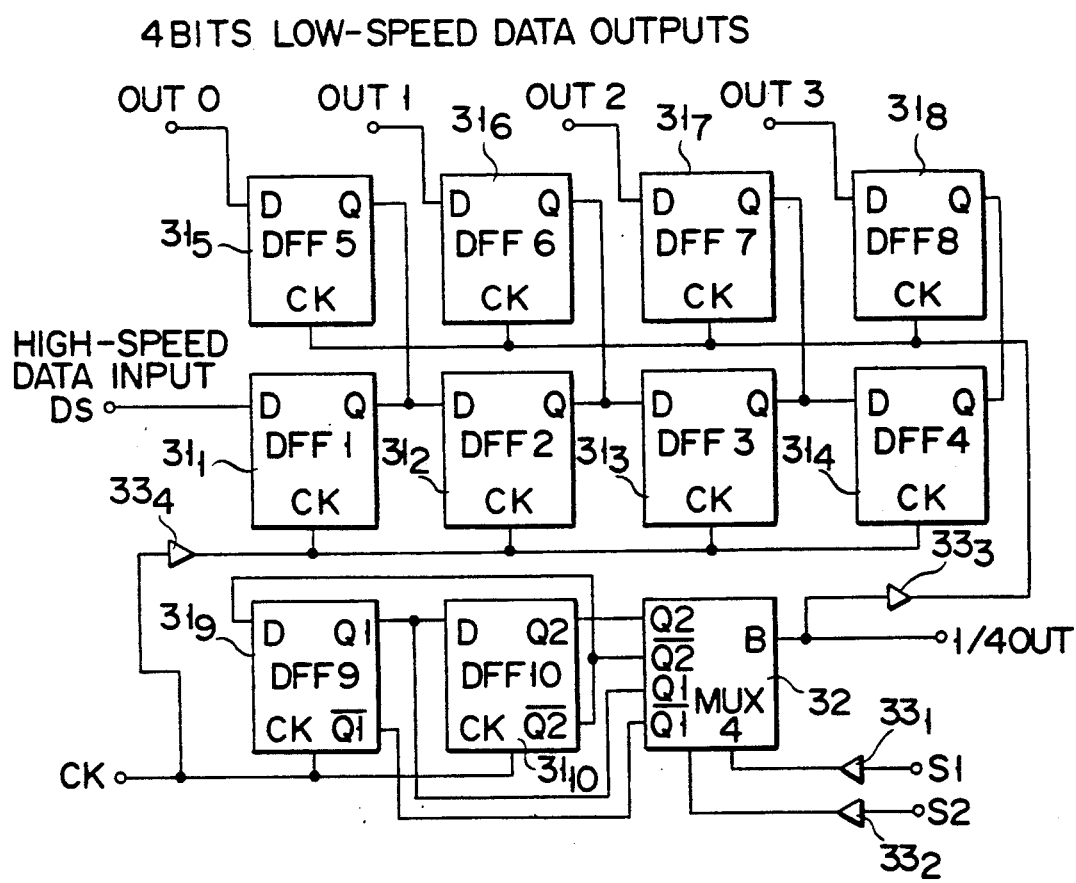
FIG. 3B is a circuit diagram showing an arrangement of the demultiplexer.

The H-L conversion circuit 40 shown in FIG. 3A serves as a 1:N demultiplexer, and has a function for converting one high-speed data into N low-speed data train. For example, a detailed circuit arrangement of the 1:4 demultiplexer 40 is shown in FIG. 3B. The demultiplexer shown in FIG. 3B includes ten DFFs $31_1$ to $31_{10}$, a clock circuit 32, and inverters $33_1$ to $33_4$. This demultiplexer has a known circuit arrangement for receiving one high-speed data $D_S$ to output 4-bit low-speed data $OUT_0$ to $OUT_3$.

A GaAs digital signal processor (DSP) which includes the above 4:1 multiplexer and 1:4 demultiplexer as high-frequency circuits was experimentally manufactured. This DSP is operated at a data processing frequency of 400 MHz.

As described above, a logic LSI tester which is commercially available at present can normally use a frequency of 200 MHz. This commercially available tester cannot directly test the experimentally manufactured IC without a test easy circuit. However, the 4:1 multiplexer is mounted on the same semiconductor chip in the arrangement according to the present invention. Therefore, this conversion circuit multiplexes signals of 100 MHz supplied from the tester to generate a data signal of 400 MHz, thus supplying the multiplexed signal to the DSP of the body.

On the other hand, a "resultant signal" of 400 MHz which is processed by and output from the DSP cannot be tested by the above-mentioned tester. Therefore, this "resultant signal" is input to the 1:4 demultiplexer, and is converted into four parallel signals each having a frequency of 100 MHz, thus outputting the converted parallel signals. Since this output can be tested by the above-mentioned LSI tester, it is easily confirmed whether the DSP can be normally operated.

As described above, according to the present invention, the 4:1 multiplexer is arranged as an input circuit for the DSP, and the 1:4 demultiplexer is arranged as an output circuit. Therefore, for example, a high-frequency test for the DSP having an operating frequency of 400 MHz can be performed by an LSI tester having a frequency of 100 MHz, thereby facilitating a high-frequency test. In addition, since an LSI tester having a frequency of 400 MHz is not required, an increase in equipment cost can be prevented.

Figure 4:
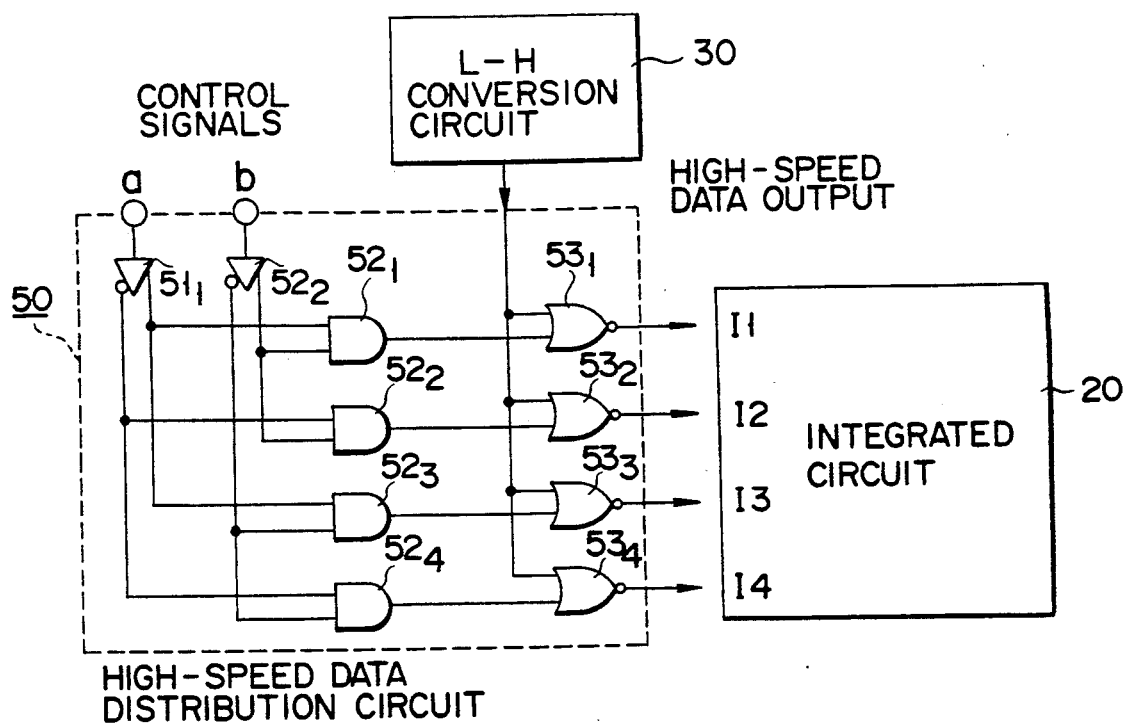
FIG. 4 is a circuit diagram showing an arrangement of a high-speed data distribution circuit.
Figure 5:
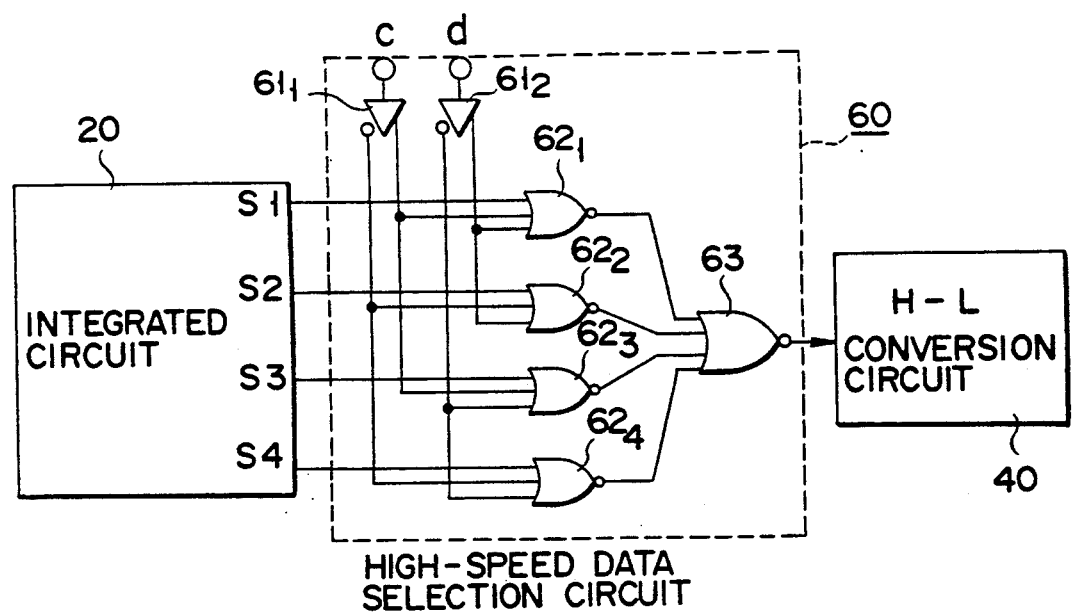
FIG. 5 is a circuit diagram showing an arrangement of a high-speed data selection circuit.

It is considered that a high-frequency test may be required for a plurality of routes of the IC body 20. In practice, the DSP section of the IC body 20 in the above embodiment has four routes in which a signal having a frequency of 400 MHz flows. Each route must be tested. In such a case, a high-speed data distribution circuit 50 shown in FIG. 4 and a high-speed data selection circuit 60 shown in FIG. 5 are employed.

More specifically, the high-speed data distribution circuit 50 includes inverters $51_1$ and $51_2$, AND gates $52_1$ to $52_4$, and NOR gates $53_1$ to $53_4$. The circuit 50 has a function for distributing high-speed data output from the 4:1 multiplexer 30 to four routes ($I_1$ to $I_4$) of the DSP section of the IC body 20 using two control signals (a and b).

On the other hand, the high-speed data selection circuit 60 includes inverters $61_1$ and $61_2$, and 3-input NOR gate 63. The circuit 60 has a function for selecting one of four "resultant signals" ($S_1$ to $S_4$) output from the DSP section of the IC body 20 by using two control signals (c and d) to output the selected signal to the 1:4 demultiplexer 40. When the IC has the above circuit arrangement, one multiplexer and one demultiplexer allow a high-frequency test for four routes.

As shown in FIGS. 2 and 3, the multiplexer and the demultiplexer have relatively complicated circuit arrangements and relatively large areas, respectively. In contrast to this, as shown in FIG. 4, the high-speed data distribution circuit and the high-speed data selection circuit have simple arrangements constituted by only logic gates, and their areas are extremely small. Therefore, in this embodiment, a chip area can be greatly reduced as compared with a case wherein four multiplexers and demultiplexers are arranged.

FIG. 6 is a schematic diagram showing an arrangement of an IC device according to another embodiment of the present invention. This embodiment has an arrangement obtained by increasing the scale of the above-mentioned DSP. In this embodiment, a large number of, e.g., 36, routes in which a high-frequency signal flows are arranged. In this case, although distribution and selection circuits respectively shown in FIGS. 4 and 5 may be employed, twelve multiplexers and twelve demultiplexers are required from the viewpoint of a response speed. Therefore, the circuit arrangement shown in FIG. 6 is employed.

More specifically, a plurality of required pads 12 are arranged around an IC body 20. The IC body with the pads 12 serves as an independent LSI. A plurality of multiplexers 30 and demultiplexers 40 are arranged in a substrate peripheral region around the IC body 20. Each multiplexer 30 is connected to the IC body 20 through the corresponding pad 12 directly coupled to an input section of the body 20, and each demultiplexer 40 is connected to the IC body 20 through the corresponding pad 12 directly coupled to an output section of the body 20. The other terminal of each of the multiplexers 30 and the demultiplexers 40 is connected to the corresponding one of the pads 11 aligned in an outermost region.

With the above arrangement, the IC body 20 is disconnected from the multiplexers 30 and the demultiplexers 40 serving as a high-frequency test easy circuit along the alternate long and short dash lines A—A, B—B, C—C, and D—D in FIG. 6 after a high-frequency test is ended. Therefore, an IC having the same shape and circuit arrangement as those of a normal IC device including the IC body 20 and its peripheral pads 12 can be obtained as a final product. Thus, since the test circuit can be disconnected from the IC body, a chip size can be decreased, and power consumed during an operation can be reduced as compared with a chip including a test circuit.

Note that the present invention is not limited to the above embodiments. In the above embodiments, a multiplexer and a demultiplexer are used as frequency conversion circuits in order to input/output data. However, when a clock is input, a frequency multiplier serving as an L-H conversion circuit, or a divider serving as an H-L conversion circuit can be used. In addition, both the circuits may be used. Various changes and modifications may be made without departing from the spirit and scope of the present invention.

As described above, according to the present invention, when frequency conversion circuits are arranged on input and output sides of an IC, a high-frequency test for the IC can be performed using an LSI tester having an operating frequency lower than that of the IC. At the same time, manufacturing cost can be decreased. Therefore, the present invention exhibits great utility.

Additional advantages and modifications will readily occur to those skilled in the art. Therefore, the invention in its broader aspects is not limited to the specific details and representative devices shown and described. Accordingly, various modifications may be made without departing from the spirit or scope of the general inventive concept as defined by the appended claims and their equivalents.

What is claimed is:

1. An IC device characterized by comprising an IC body having input and output sections, and high-frequency circuits for testing high-frequency characteristics of said IC body on a single chip, said circuits including an L-H frequency conversion circuit arranged on the input section side of said IC body, and an H-L frequency conversion circuit arranged on the output section side of said IC body.

2. An IC device according to claim 1, wherein said L-H frequency conversion circuit comprises a multiplexer for converting low-frequency data into high-frequency data, and said H-L frequency conversion circuit comprises a demultiplexer for converting high-frequency data into low-frequency data.

3. An IC device according to claim 1, wherein said circuits comprise means for switching a connecting state between said conversion circuits and said IC body in response to an external control signal.

4. An IC device according to claim 1, wherein said circuits are arranged around said IC body, and can be disconnected from said IC body after a test is completed.

* * * * *